(12) United States Patent
Klein et al.

(10) Patent No.: US 6,892,328 B2
(45) Date of Patent: May 10, 2005

(54) METHOD AND SYSTEM FOR DISTRIBUTED TESTING OF ELECTRONIC DEVICES

(75) Inventors: Joseph C. Klein, Cedar Park, TX (US); Jack C. Little, Georgetown, TX (US); Paul R. Hunter, Austin, TX (US); Archer R. Lawrence, Austin, TX (US)

(73) Assignee: Tanisys Technology, Inc., Austin, TX (US)

( * ) Notice: Subject to any disclaimer, the term of this patent is extended or adjusted under 35 U.S.C. 154(b) by 581 days.

(21) Appl. No.: 09/966,541

(22) Filed: Sep. 27, 2001

(65) Prior Publication Data

US 2002/0042897 A1 Apr. 11, 2002

Related U.S. Application Data

(60) Provisional application No. 60/236,756, filed on Sep. 29, 2000.

(51) Int. Cl.$^7$ .................................................. G06F 11/00
(52) U.S. Cl. ............................ 714/42; 714/27; 714/718
(58) Field of Search ........................... 714/42, 27, 718, 714/719, 31, 25, 5

(56) References Cited

U.S. PATENT DOCUMENTS

| | | | | |
|---|---|---|---|---|
| 3,910,322 | A | * 10/1975 | Hardesty et al. | ............... 714/25 |
| 5,371,883 | A | * 12/1994 | Gross et al. | .................... 714/38 |
| 5,682,472 | A | * 10/1997 | Brehm et al. | .................. 714/25 |
| 6,360,268 | B1 | * 3/2002 | Silva et al. | ................... 709/227 |
| 6,550,021 | B1 | * 4/2003 | Dalphy et al. | ................. 714/11 |
| 6,604,209 | B1 | * 8/2003 | Grucci et al. | .................. 714/38 |
| 6,701,470 | B1 | * 3/2004 | Mullarkey et al. | ........... 714/718 |
| 2001/0054161 | A1 | * 12/2001 | Wooddruff | .................... 714/27 |

OTHER PUBLICATIONS

W3C, Extensible Markup Language (XML) 1.0, Feb. 10, 2998.*
Microsoft Press Computer Dictionary, 1997, Microsoft Press, Third Edition, pags 210 and 328.*
Collegiate Dictionary, 1997, Merriam Webster, Tenth Edition, p. 780.*

\* cited by examiner

*Primary Examiner*—Scott Baderman
*Assistant Examiner*—Marc M Duncan
(74) *Attorney, Agent, or Firm*—Baker Botts L.L.P.

(57) ABSTRACT

A distributed tester method and system communicates test recipes for testing electronic devices from a host computer over a network to a test site. The test site translates test recipes into test instructions for execution by a test engine that determines the status of the electronic device. For instance, in a tester for testing memory, a test recipe is defined and stored with a host computer to determine test data for storage on the memory device under test at the test site. The host computer controls execution of the test recipe over the network. The test recipe is defined and stored in an XML formatted data file transmitted over the network to a processor at the test site. The test site processor translates the XML formatted data into test instructions for execution by a test engine. The test engine determines whether the memory device under test accurately stores data and provides the results, such as erroneously stored data, to the host computer through the network. A test design host and a global data master also interface with the network to aid the design and storage of test recipes. The distributed test method and system advantageously improves flexibility of testing over a geographically disbursed area and with divergent test recipes and devices under test.

45 Claims, 10 Drawing Sheets

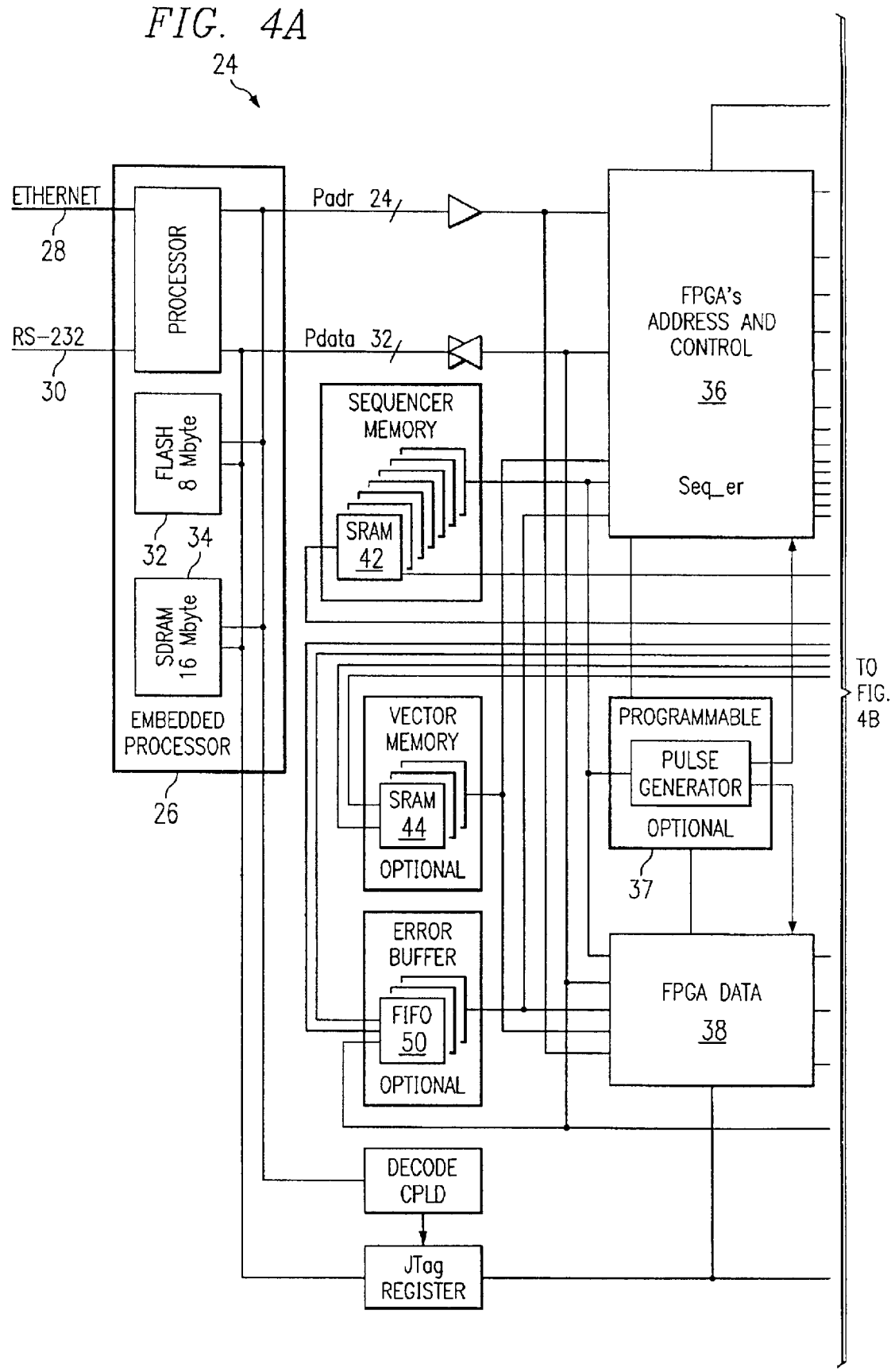

METHOD AND SYSTEM FOR DISTRIBUTED TESTING OF ELECTRONIC DEVICES

RELATED PATENT APPLICATION

This application claims the benefit of U.S. Provisional Application No. 60/236,756 filed on Sep. 29, 2000 and entitled "Method and System for Distributed Testing of Electronic Devices".

TECHNICAL FIELD OF THE INVENTION

This invention relates in general to the field of testing of electronic devices, and more particularly to a method and system for distributed testing of electronic devices.

BACKGROUND OF THE INVENTION

Data processing depends upon the accurate processing and storing of data by electronic devices, such as integrated circuits, including microprocessors and memory devices. Electronic devices are essential to the operation of everything from high tech devices like computers and cell phones to old economy devices like automobile fuel injection and ignition systems. For instance, more permanent instructions such as BIOS are typically stored in non-volatile memory devices, such as programmable read only memory ("PROM") or flash memory and then supplied to microprocessors which compute results typically stored in random access memory (RAM). Even minor errors in the processing or storage of data by electronic devices may lead to significant difficulties.

Typically, manufacturers test electronic devices with custom hardware interfaces before installation into equipment to ensure the functionality and determine the accuracy of the electronic device. These tests are typically performed by providing predetermined input signals and then measuring output signals for comparison against expected results. For example, the Sigma 3 tester sold by Tanisys Technologies, Inc. tests RAM memory modules by storing data in the module, reading the stored data, and then comparing the read data against expected data. Another conventional method for testing electronic devices is providing test signals with a pin driver. Pin drivers provide comprehensive testing of electronic devices but are expensive and complicated to operate. A less complicated and expensive method for testing electronic devices is to insert the device into a motherboard, if possible, and determine if errors occur under operating conditions. However, this type of testing is much less comprehensive and has difficulty determining operability under extreme conditions.

One significant difficulty with conventional testers is the complicated and inflexible nature of test recipes run by the tester to test the equipment. The testing of memory devices is illustrative. A conventional RAM memory module stores data as zeroes and ones in columns and rows identified as addresses. Testers frequently have difficulty identifying all faults in a memory device since the output from a memory cell having a material defect may often match a projected output purely by chance. Thus, to ensure accurate operation of a memory module, testers often run a variety of algorithms that create data having an enhanced probability of revealing device defects.

Another example of the difficulty of testing memory devices is the identification and tracking of particular device defects. For instance, flash memory devices typically have a greater number of defects than do RAM devices. Rather than discarding defective devices, flash memory devices are typically reprogrammed to avoid the use of defective cells. Similarly, defects in RAM devices are sometimes tracked to determine whether defects are repeated in different devices and whether the nature of the defect is correctable. Comprehensive tracking of defects presents a formidable logistic problem with large scale device testing across numerous testers. For instance, with complex memory testing, variances in test procedures may skew results in a way that is not apparent.

Another difficulty in testing devices is obtaining adequate throughput and efficient use of testing resources. Complex testers, which contain pin drivers, represent a significant capital investment so that idle tester time comes with a substantial cost. Consider the simplified example of a test facility having four testers to test flash memory devices with four recipes. An assembly line approach in which each tester runs a recipe results in tester down time. A batch approach in which all testers run the same recipe results in increased testing time. Individual custom testing interfaces lack the bandwidth to communicate with multiple sites so that the custom hardware is not typically scalable and able to run synchronous tests.

SUMMARY OF THE INVENTION

Therefore, a need has arisen for a method and system which coordinates testing of electronic devices at plural distributed test sites interfaced through a network.

A further need exists for a method and system for testing electronic devices which is scalable to allow capacity growth with minimum impact on testing throughput.

A further need exists for a method and system for testing electronic devices which enhances throughput for testing multiple recipes and tracking test results of plural sites.

In accordance with the present invention, a method and system for distributed testing of electronic devices is provided that substantially eliminates or reduces disadvantages and problems associated with previously developed methods and systems for testing electronic devices. A host computer interfaced with plural test sites through a network communicates test recipes to the test sites. A processor associated with the each test site translates the test recipes into test instructions for testing electronic devices associated with the test site. Each test site provides test results back to the host computer for storage, tracking and reporting.

More specifically, in one embodiment, the distributed test sites are adapted to accept memory devices, such as RAM modules or flash memory devices. A test engine of the test site generates test data, including address data and storage data, for storage on a device under test. For instance, a sequencer test engine provides algorithmically-generated test data and vector test data for storage on the memory device under test. The test engine then reads the stored test data, compares the read stored data with the test data, and determines whether the memory device under test accurately stored the test data.

An embedded processor on the test site interfaces with the network and the test engine to provide the test instructions to the test engine. The embedded processor receives recipes from the network and translates the recipes into test instructions for execution by the test engine. More specifically, test recipes are communicated to the embedded processor over the network with TCP/IP protocol to support Extensible Mark-up Language (XML) formatted data. Local flash and RAM memory store the XML's schema and associated test instructions to enable the translation of test recipes into binary data for execution by the sequencer.

Tests sites communicate with one or more host computers through a network interface, such as Ethernet or, over greater distances, wide area networks (WANs) and the Internet. Host computers direct testing operations through the download of test recipes to one or more predetermined test sites. For instance, a host computer downloads an XML formatted data file, such as by using file transport protocol (FTP), Network File System (NFS) or User Datagram Protocol (UDP), over the network with TCP/IP. By communicating test recipes in a standardized format over an open network, host computers may selectively control test sites without interfering with the operations on uncontrolled test sites. For instance, a first host computer may control a first set of test sites simultaneous with the control by a second host computer of a second set of test sites. Further, a host interfaced with the network may act as a global data master to coordinate testing among plural test sites and to store test results in a centralized location.

In one embodiment, a test designer system interfaces with the network to create test recipes. Recipes created on the test designer system are then provided to host computers for use at test sites. The test designer provides a graphical user interface that supports development of test recipes for specific electronic devices, such as RAM memory modules or flash memory. XML schema and executable objects are provided to host computers and to test site memory for execution of desired recipes at the test sites under the direction of the host computers.

The present invention provides a number of important technical advantages. One important technical advantage is the coordinated testing of electronic devices at distributed test sites interfaced with a network. Coordinated testing through distributed test sites enhances efficiency by allowing execution of varying test recipes across the test sites and the testing of different types of electronic devices. Therefore, tests are allowed to run asynchronously and independently. Improved testing efficiency decreases cost by decreasing down time of expensive testing equipment and reducing operator oversight and intervention to perform testing.

Another important technical advantage of the present invention is that it is scalable and flexible to adapt to capacity growth. For instance, the use of an embedded processor at each test site to translate XML formatted data into executable test instructions leverages the network to control testing without impacting testing throughput. The addition of test sites to the network thus does not slow the testing process at other test sites. Further, as test sites are added or deleted from the network, coordinated testing and tracking of results simplify large scale testing of multiple electronic devices without significantly increased operator involvement. Specific test sites associated with a network may test different devices, such as SDR, DDR, DRAMs, SRAMs, Rambus devices, or flash devices. dr

BRIEF DESCRIPTION OF THE DRAWINGS

A more complete understanding of the present invention and advantages thereof may be acquired by referring to the following description, taken in conjunction with the accompanying drawings, in which like reference numbers indicate like features, and wherein.

DETAILED DESCRIPTION OF THE INVENTION

Preferred embodiments of the present invention are illustrated in the figures, like numerals being used to refer to like and corresponding parts of the various drawings.

Figure 1:
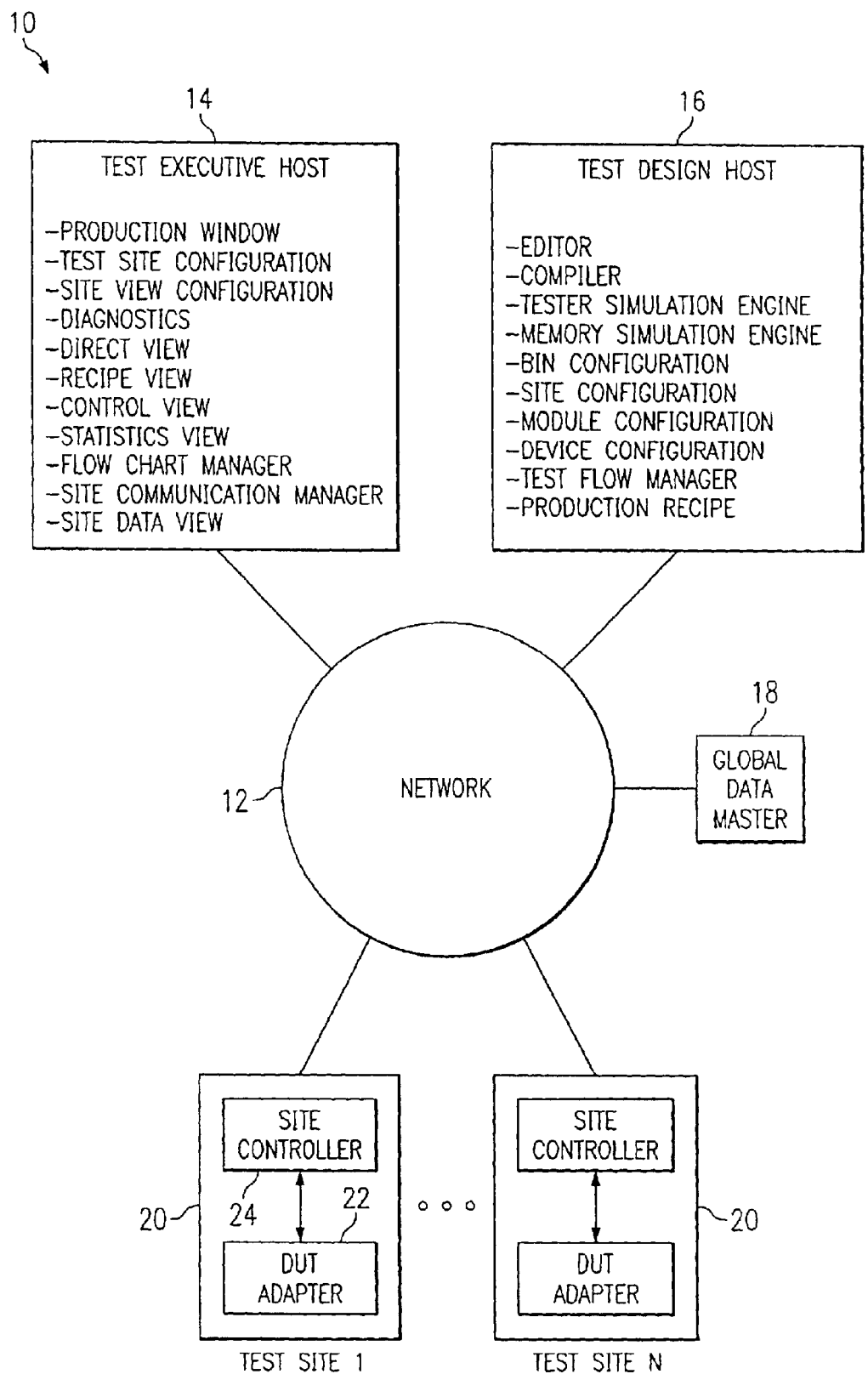
FIG. 1 depicts a block diagram of plural test sites distributed from a host and interfaced through a network.

Referring now to FIG. 1, a block diagram depicts a distributed testing system for testing electronic devices, in this case, specifically for testing flash memory devices. A network 12 interfaces a test executive host 14, a test design host 16, a global data master 18, and plural test sites 20. Network 12 provides a flexible open communication mechanism and enables scaleable test solutions. For instance, network 12 may comprise an Ethernet local area network (LAN) distributed throughout a testing facility. Alternatively, network 12 may comprise a wide area network (WAN) or Internet solution that supports communication between geographically distributed test facilities using TCP/IP. Network 12 enhances testing flexibility, scalability and simplicity by distributing test facility intelligence, including test design and execution, from physical testing hardware.

Test design host 16 is a work station or personal computer that supports the creation of test recipes for the testing of specific electronic devices. In the embodiment depicted by FIG. 1, a number of modules of the test design host 16 cooperate to design test recipes for memory devices. An editor module supports the generation of source code with a color coded, syntax directed text editor. The text editor displays line numbers and errors generated from the compiler module to aid in identification of source code lines associated with errors, and also prints desired text files. The compiler module translates text recipe files into an executable compilation and a variety of supporting files. For instance, the compiler outputs binary VLIW for execution, a hexadecimal VLIW for simulation and a listing file.

Test design host 16 includes a tester simulation engine module and a memory simulation engine module that allows the testing and debugging of test recipes in a software driven environment that requires no supporting hardware. Both the tester and memory simulation engines are synchronous, cycle accurate, behavioral simulators, with the memory simulator engine typically executing several clocks for each clock of the tester simulation engine. For instance, in a simulation of flash memory testing, the memory simulation engine has a 20:1 clock ratio, giving the flash module a resolution of 1 nS. For simulation of memory devices, the tester simulation includes register windows to display current values of hardware registers, with one window per logical group (i.e., address, data, etc . . . ); bus windows that graphically display the activity to and from the simulated memory device under test; and memory windows that allow a user to examine and modify the contents of various memory buffers in the simulated tester system, such as error buffer memory, scratch pad memory, capture memory, vector memory, and instruction memory. The memory simulation engine module provides a mechanism to simulate a memory device under test, allowing the user to examine and modify the device under test memory contents and providing a method for simulating faults in the memory device under test. The memory simulation engine allows specification of timing parameters for a simulated memory device under test, and uses these parameters to check transactions to and from the simulated device under test, providing warning messages if parameters are violated.

Test design host 16 includes modules for bin, site, memory module and device configurations. The bin configuration module allows a user to map user bins to software bins and software bins to hardware bins so that any bin level may be used for sorting of device results. The site configuration module allows a user to specify the number of rows, columns and blocks into which the test sites are arranged, and includes a graphical editor that assigns test site identifiers to test site icons so that, in test executive host 14, the icons are selectable to view information about a site. The memory module configuration module allows a user to draw a module outline or select a module outline from a predefined list, place memory devices on the module outline, and assign a device identifier to each device on the module. A memory module configuration module is applicable for testing assembled memory modules as opposed to individual memory chip devices or flash memory devices. The device configuration module allows a user to select a device configuration from a predefined list, and to add or delete devices from the list. For instance, memory device configuration information includes the number of rows, columns, blocks, block sizes and data width plus additional user defined data. The device configuration information is combined with a test recipe at compile time to created a compiled test recipe.

Figure 2:
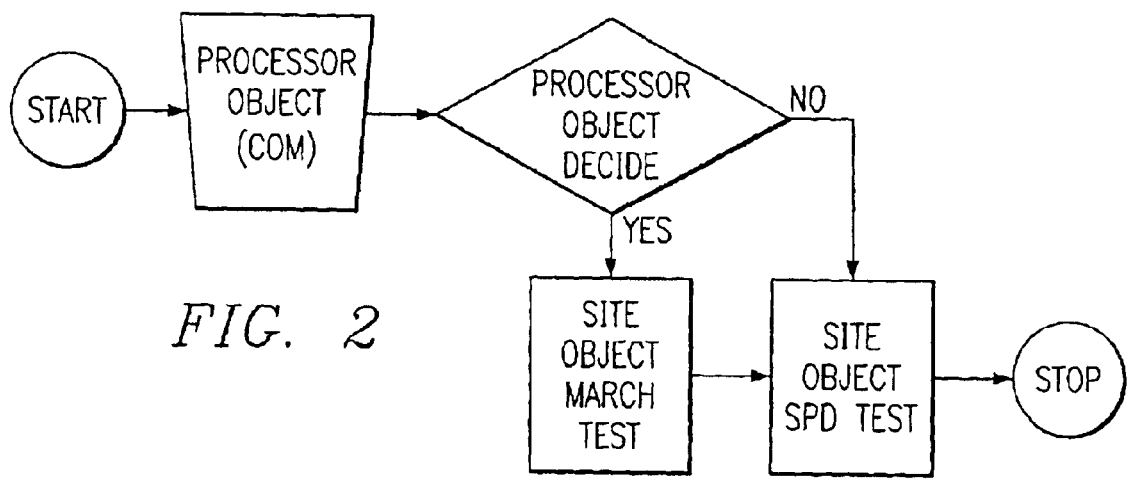
FIG. 2 depicts a sample flow chart for a processor object component.

Test design host 16 includes a test flow manager module that allows a user to create a hierarchical two dimension flow chart representing test flow with five basic components. Three of the test flow manager components, the labels, lines and text components, are native to the test flow manager and not user extensible. Two of the test flow manager components, the site objects component and work station objects component, are COM objects that are user extensible with a minimum set of methods and properties. These COM objects are registered with test executive host 14 operating system if the minimum set of methods and properties are present. FIG. 2 depicts that each flow chart component has a few common properties, including an insertion point on the flow chart page, a scale factor, a state name and the component name. For instance, FIG. 2 depicts a flow chart for a processor object component.

The native flow manager components enable storage of data in well-formed XML format. The labels component represents a named state in a test flow which can be jumped to directly. An exemplary label format is depicted by the following XML schema:

```
<label>
    <name>      LABEL_NAME      </name>
    <state>     STATE_NAME      </state>
    <x>         220             </x>
    <y>         120             </y>
    <scale>     1.0             </scale>
</label>
```

The lines and text components enable annotation of the flow chart and the display of text on the flow chart. Exemplary lines and text components are illustrated by the following XML schema:

```
<text>
    <name>      TEXT_NAME       </name>
    <state>     NO_STATE        </state>
    <font>      Times Roman     </font>
    <string>    This is a string </string>
    <x>         220             </x>
    <y>         125             </y>
    <points>    12              </points>
    <justify>   Right           </justify>
    <format>    Bold            </format>
    <scale>     1.0             </scale>
</text>
<line>
    <name>      LINE_NAME       </name>
    <state>     NO_STATE        </state>
    <x>         190             </x>
    <y>         115             </y>
    <x2>        290             </x2>
    <y2>        115             </y2>
    <arrow>     no              </arrow>
    <color>     Red             </color>
    <weight>    10              </weight>
    <scale>     1.0             </scale>
</line>
```

A flow chart component has two primary elements, the flow chart name and identification of whether or not the flow chart is dynamic. Dynamic flow charts are parsed at run time to allow for greater flexibility, such as self modifying flow charts, and nondynamic flow charts are parsed at load time, which is more efficient. A flow chart component allows the inclusion of other flow charts as illustrated by the following exemplary XML schema.

```
<flow chart>
    <name>      FLOW_NAME       </name>
    <state>     STATE_NAME      </state>
    <x>         220             </x>
    <y>         120             </y>
    <scale>     1.0             </scale>
    <file>      NextFlow.xml    </file>
    <dynamic>   no              </dynamic>
    <reporting> no              </reporting>
</flow chart>
```

The site object component provides a COM interface to the test site routines that compile, transmit, run and process the results of test programs on individual test sites. A site object component includes minimum required methods for execution. A site object executes and then is queried for the name of the next state in a transition state. A compile method compiles a test file into binary code for transmission to a test site, a transmit method sends the compiled test file to a test site and a run method executes the compiled code at the test site. Upon execution, a next method returns the name of the next state of the flow chart, a display method returns a set of line and text directives for display on the flow chart windows, a load method loads a site object from an XML test file, and a save method saves a site object to the XML test file. A setstate sets one of the site objects transition states to allow query to the object for the name of the next state. In addition to these required methods, optional methods may be included to aid in dealing with parameters and transition state control. Site object properties include the name of the site object, the state name, the x location of the inserted object on the flow chart, the y location of the inserted object on the flow chart, the scale of the inserted object, the file name of the test program, and identification of whether the site object is dynamic.

The processor object component provides a COM interface to routines that execute on test executive host 14, and perform all data manipulation and process decisions. Processor objects are delivered from test design host 16 to test executive host 14 in both object and source form to allow end users to modify the processor objects for specific requirements. As with site objects, processor objects have a minimum required set of methods and properties and use transition states. The required set of methods includes a run method for executing the processor object, a next method for returning the name of the next state of the flow chart, a display method for returning a set of line and text directives, a load method for loading site objects from an XML test file, a save method for saving site objects to an XML test file and a setstate method for setting the site object transition states. In addition, processor objects may include optional methods for dealing with parameters and improving transition state control. Processor objects include required and optional properties such as required name, state, x, y, and scale properties and optional parameter and transition state properties.

Figure 3:
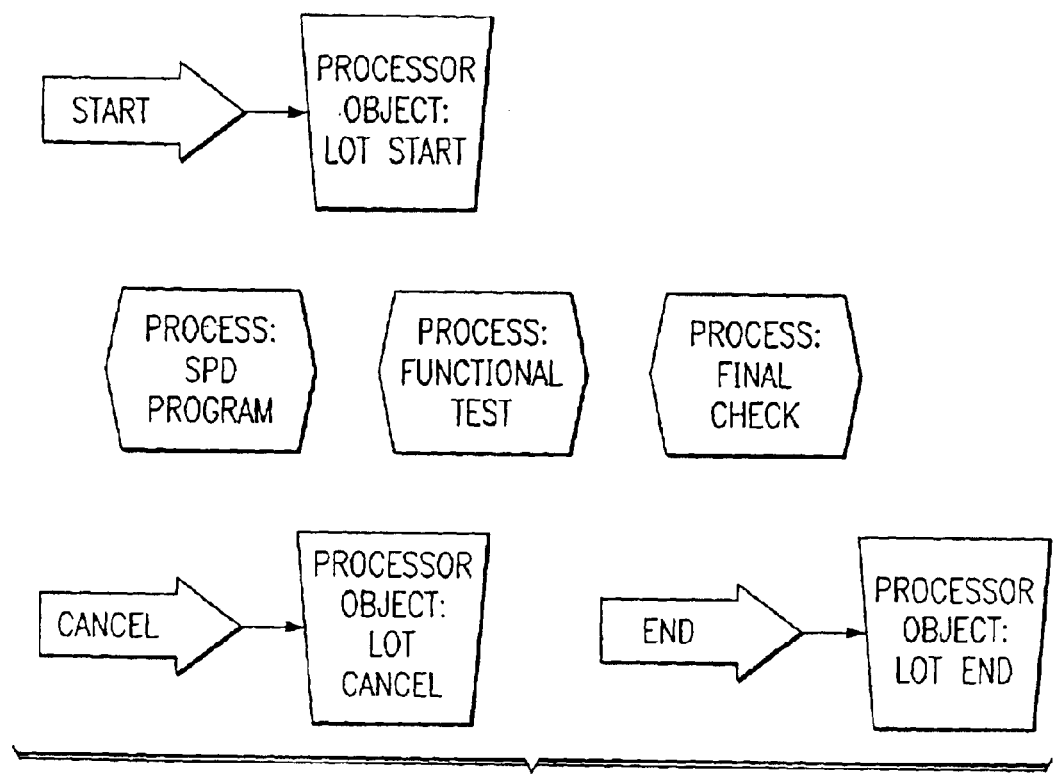
FIG. 3 depicts an illustrative production recipe block diagram.

Test design host 16 also includes a production recipe module that creates production recipes for execution in cooperation with flow charts created by the test flow manager module. FIG. 3 depicts an exemplary production recipe that connects start, end and cancel events to flow charts and identifies a list of process recipes that can run on a given site. The start, cancel and end flow charts are one processor object each in the example depicted by FIG. 3, but can include additional processor objects. In addition, the production recipe of FIG. 3 includes three unconnected process flow charts representative of different processing steps used in a production flow. Test executive host 14 can assign on a site by site basis which process flow chart executes.

Referring again to FIG. 1, test executive host 14 includes a number of modules for execution of a production recipe. Plural test executive hosts 14 may interface with network 12, with each test executive host controlling one or more test sites 20. Each test site 20 runs a single process recipe under direction of a single test executive host 14 with each test site executing its own thread to simplify multitasking in the distributed test environment.

A production window module of test executive host 14 provides a panel map view that allows a user to view the status of all production sites under the control of the test executive host 14. An icon represents each site within the panel map view with the icons organized by settings, such as row, column and block settings, so that selection of a site icon opens a site view window or a results view window. The site view configuration module allows a user to observe the progress of a single site as it transverses a flow chart. A results view window graphically depicts the results once the flow chart is complete.

A test site configuration module maps physical test sites to logical site numbers and displays a list of logical sites and physical sites. Using this window, a user may attach a site to a test process and assign a site to a site synchronization group. The assignment of a physical site to a logical site enables an LED on the physical site to indicate a confirmation of the assignment.

A diagnostics module provides a view similar to that of the production module, but allows a user to run diagnostics on a selected test site by selection of the icon for the test site. Diagnostic functions for a test site vary depending on the state of the test site and the diagnostic fixtures installed on that site.

The direct view, recipe view, control view and statistic view modules support windows to simplify the user interface with testing operations. The direct view window provides a "Telnet" connection to a test site with which a user may run stand alone diagnostics, command line utilities and may view site configuration and results files. The recipe view window allows a user to statically explore the flow charts in a production recipe and edit editable fields. The control view window provides graphical buttons to stop and start a test production run. The statistic view window displays a bar graph of any user, software or hardware bin level with statistics calculated for the current production run.

The flow chart manager module is a multi-threaded object responsible for directing the flow chart traversal for each test site. The flow chart manager module directs flow chart traversal with communications supported by the site communication manager module, a multi-threaded object that communications using a TCP level socket connection. The site data view module is a COM object that acts as an intermediate level to format and display test return data.

Test executive host 14 and test design host 16 interface through network 12 with a global data master 18. Global data master 18 is a work station or personal computer that controls all persistent data for one or more of test executive hosts 14 and communicates via sockets through test executive hosts 14 with test sites 20. Global data master 18 stores data as a large XML document in free form under the control of test executive hosts 14, processor objects and site objects. An exemplary XML formatted document is:

```
<production>
        <recipe>        filename.xml    </recipe>
        <lot>           lot number      </lot>
        . . . .
        <workstation>
            <name>              workstation name        </name>
            . . . .
            <process>
                    <name>  SPD program            </name>
                    <site1_cnt> 2                  <site1_cnt>
                    <site1_1>
                    [XML Data returned from test site]
                    </site1_1>
                    </site1_2>
                    [XML Data returned from test site]
                    </site1_2>
            </process>
            <process>
                    <name>          Functional Test </name>
                    <site1_cnt> 20                          <site1_cnt>
                    <site1_1>
                    [XML Data returned from test site>
                    </site1_1>
                    . . . .
                    <site1_20>
                    [XML Data returned from test site]
                    </site1_20>
            </process>
            . . . .
        </workstation>
        <workstation>
        </workstation>
</production>
```

Using XML transferred over network 12, global data master 18 acts as a central repository for storing test data, including production recipes and test results.

The actual testing of electronic devices is performed at test sites 20 by inserting the device in a device under test adapter 22, which provides a physical interface with the device under test. Different types of electronic devices may be tested by interchanging device under test adapter 22 to interface with the electronic device as appropriate, such as by providing various pin adapters. Execution of device testing is directed by site controller 24 under instructions received from test executive host 14. Site controller 24 communicates with test executive host 14, runs test programs and reports resulting test data.

Figure 4B:
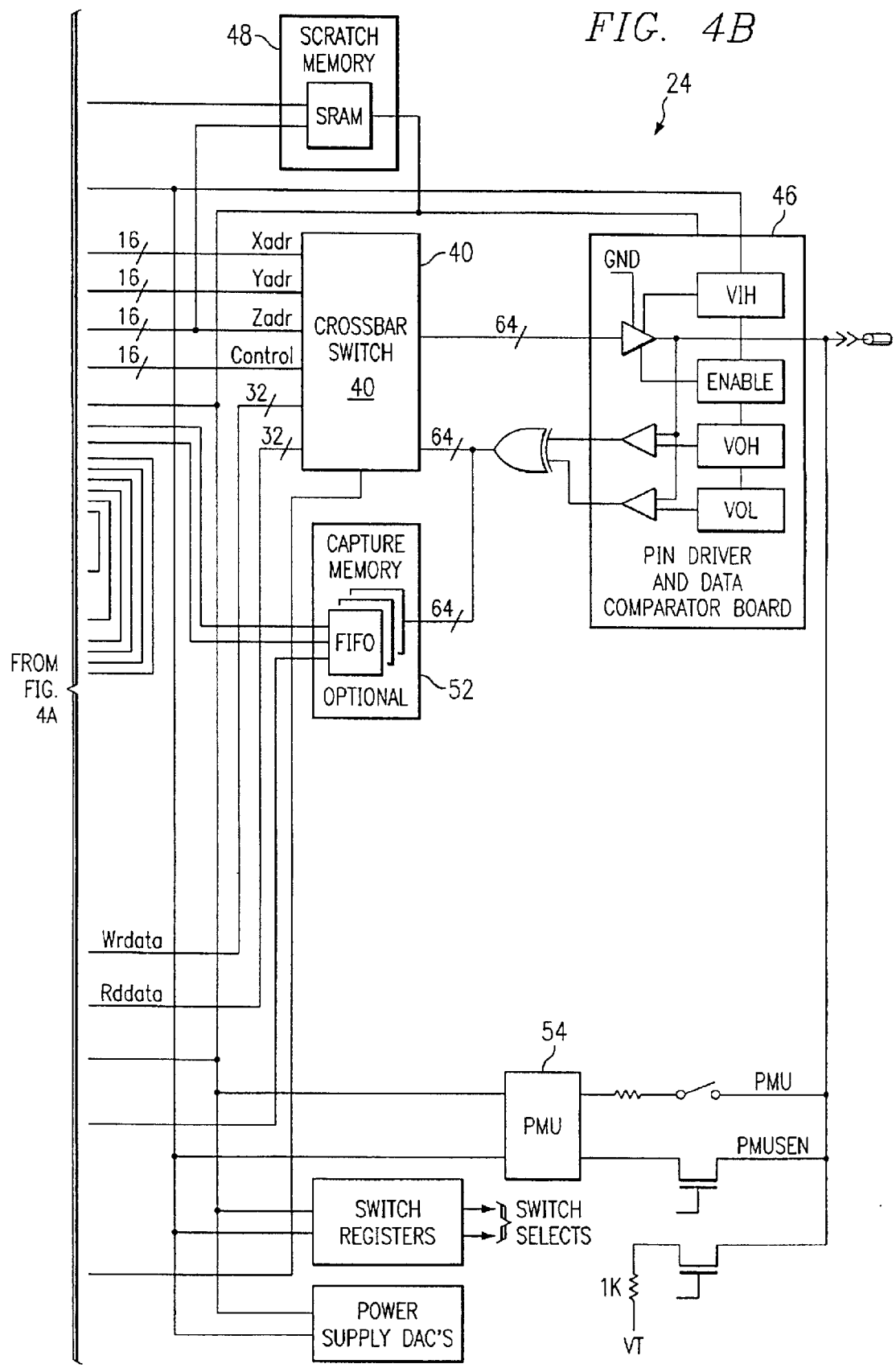
FIG. 4 depicts a block diagram of a device test site.

Referring now to FIG. 4, a block diagram for site controller 24 is depicted. An embedded processor 26 communicates with network 12 through an Ethernet interface 28 or serial RS-232 interface 30. Embedded processor 26 is an Intel strong arm 1110 processor operating in cooperation with eight megabytes of flash memory and 16 megabytes of SDRAM memory. Embedded software based upon a real time version of UNIX OS-9 provides TCP/IP communication, file system support and development and debug capabilities. The OS-9 boot image is transferred to site controller 24 at boot time so that flash memory 32 is not re-programmed.

Embedded processor 26 supports a communication demon that receives command messages from test executive hosts 14. A command message is a command line to execute a program located on the embedded file system of embedded processor 26. Commands are downloaded to embedded processor 26 via file transfer protocol ("FTP") and include instructions that a test site 20 run commands from a specific work station, report status such as idle or running, apply calibration data, execute a test or run diagnostics. In order to execute a test, embedded processor 26 transfers a test file into a test engine, such as sequencer 36, initiates the test engine, applies any post execute calibration data, formats return data on the local file system, and reports completion to test executive host 14. The file system uses SDRAM 34 to store data.

Upon completion of a test, embedded processor 26 formats test results into well-formed XML data file for transfer to executive host 14. For example, the following exemplary test file depicts results from a test:

```

<name>        &testName </name>
    <pin>
        <name>        A1 </name>
        <1kg read>    &leakA1_read</1kg read>
        <1kg exp>     &leakA1_exp</1kg exp>
    <pin>

```

Results from the test replace the ampersand depicted in the XML data file and the data file is then transferred by FTP to test executive host 14, which adds the data block to global data master 18.

Figure 5:
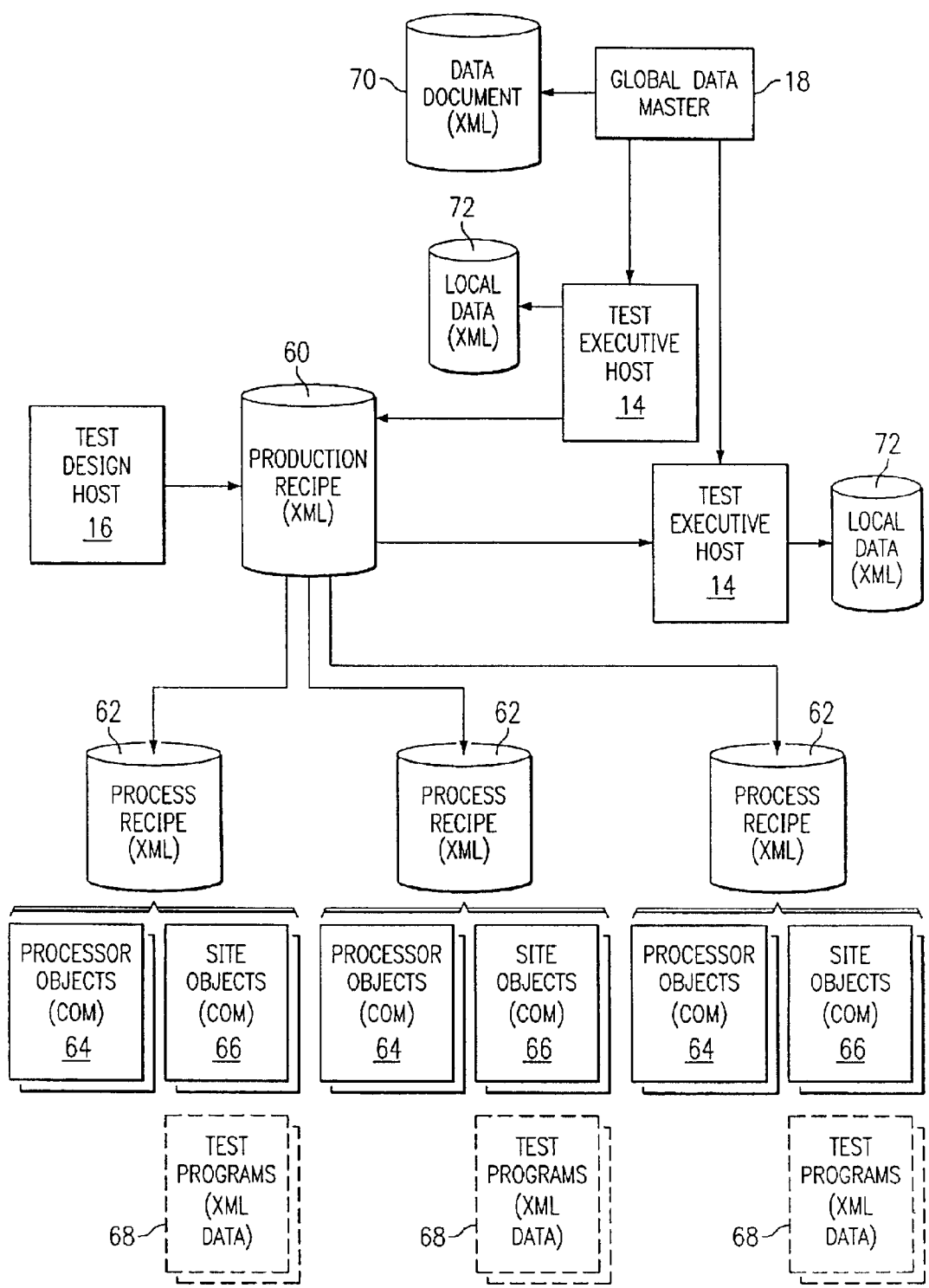
FIG. 5 depicts a block diagram of data structures for a distributed testing system.

Referring to FIG. 5, a block diagram depicts the data structure of a distributed test system. Test design host 16 creates a production recipe 60 stored in XML format. The production recipe 60 includes one or more process recipes 62, also stored as XML formatted data, which includes specific data for generating test instructions at a test 24. Processor objects 64 support communication between test executive host 14 and test site 24, site objects 66 operate on site 24 in cooperation with processor object 64, and test program 68 are XML formatted data corresponding to instructions operable on the hardware of test site 24. Test design host 16 cooperates with test executive host 14 to provide production recipe 60 through the network for execution of process recipes at test sites 20 under the direction of test executive host 14. Test executive host 14 directs storage of production recipe 60 as XML data documents 70 of global data master 18. Additionally, test executive host 14 utilizes local data storage 72 to call data from global data master 18 during execution of tests.

Referring back to FIG. 4, processor 26 receives test recipes as XML formatted data, and translates the XML formatted test recipes into binary instructions based on files stored in SDRAM 34. Processor 26 operates under a local operating system, such as Windows CE or OS9, stored in flash memory 32. The binary instructions from processor 26 proceed to a sequencer 36 and data generator 38 for execution of the instructions to generate test data for a device under test. The instructions from processor 26 allow sequencer 36 and data generator 38 to generate addresses of very large instruction word data stored in sequencer memory 32 SRAM. Alternatively, the instructions may call vector data stored in vector memory 44. In addition, the binary instructions contain information to support the algorithmic generation of address and storage data to store test data on a device under test.

Figure 6:
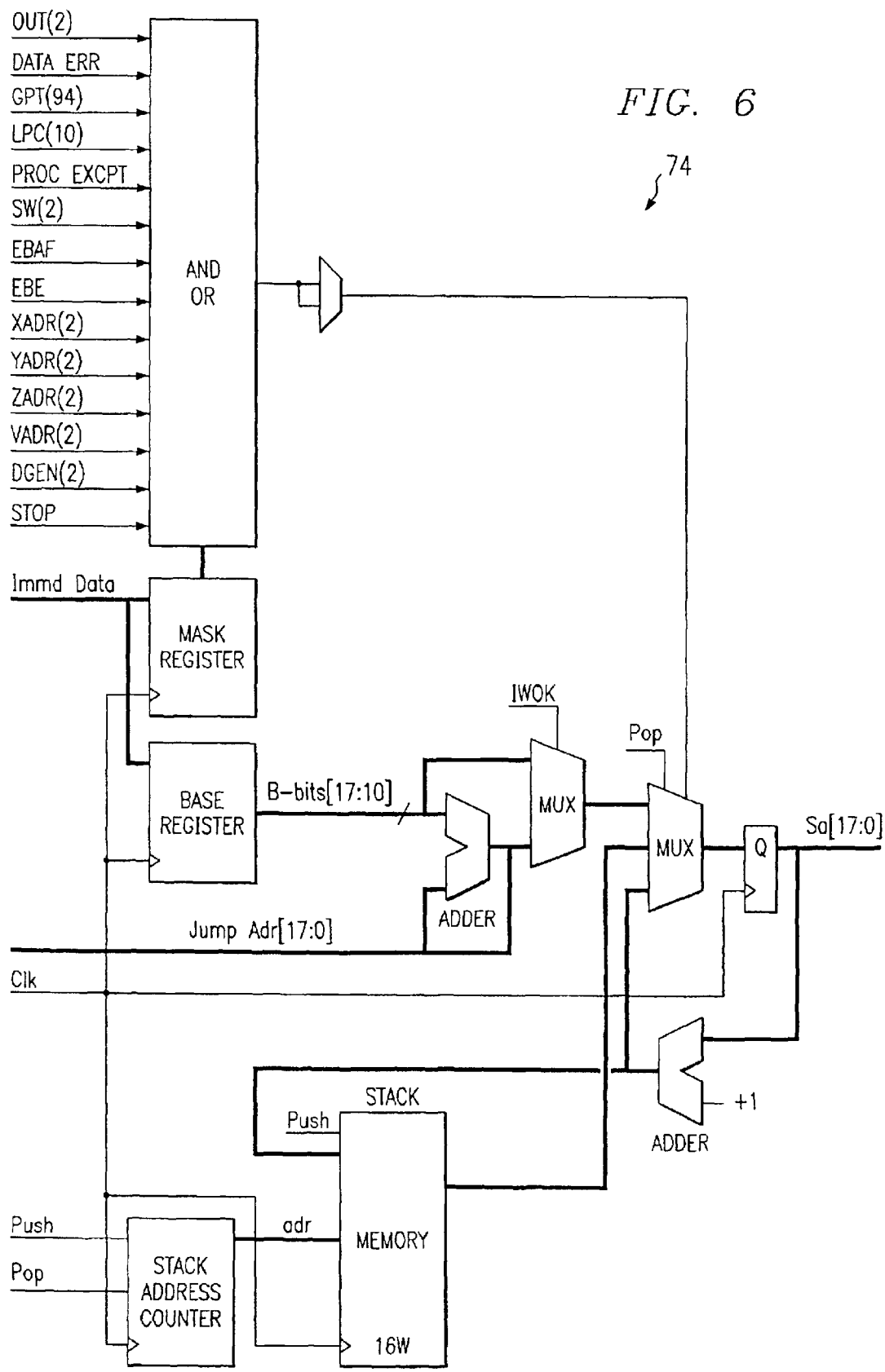
FIG. 6 depicts a block diagram of a VLIW SRAM address generator.

Referring now to FIG. 6, a block diagram depicts a VLIW SRAM address generator 74 located within sequence 36 which generates addresses to very long instruction word SRAM arrays during loading and reading of the SRAM 42 by processor 26 and during instruction execution for functional testing of a device under test. Eighteen bit very long instruction word SRAM addresses are generated at 50 MHZ. The address generator provides a four stage execution pipeline for minimum loop length.

A base address register determines the address driven to the SRAM and provides the address of the first instruction fetched after initiation of the sequencer and an offset to which is added the target address of any successful jump or call instruction. This allows VLIW routines to be relocated without source modification to the supported code pages, and allows code to span multiple code pages during execution. If the sequencer is idle, the base register allows the processor 26 to access individual locations within the SRAM 42. Processor 26 loads SRAM 42 before testing of a device, and sequencer 36 is then used to generate addresses to SRAM 42 during writing and reading of processor 26. If sequencer 36 is not executing instructions, the SRAM address is incremented for each access by processor 26 to facilitate the loading of sequential SRAM locations. The VLIW SRAM 42 provides commands fields to control field programmable gate arrays within sequencer 36 and to field data field programmable gate arrays within data generator 38 to initiate and verify access to the device under test. VLIW instructions initiate a variety of different operations, such as:
jumping to a new VLIW instruction based on hardware state;
issuing a command to the device under test while controlling each valid bit of the transaction command;
updating x, y and/or vector address source registers;
updating the right data or read comparison data;
loading 32 bit or less immediate data;
storing commands to error buffers;
loading or decrementing various counters and/or timers supported by the device under test;
setting values for power supply, voltages, or PMU inputs;
initiating PMU readings and saving results in memory.

Figure 7A:
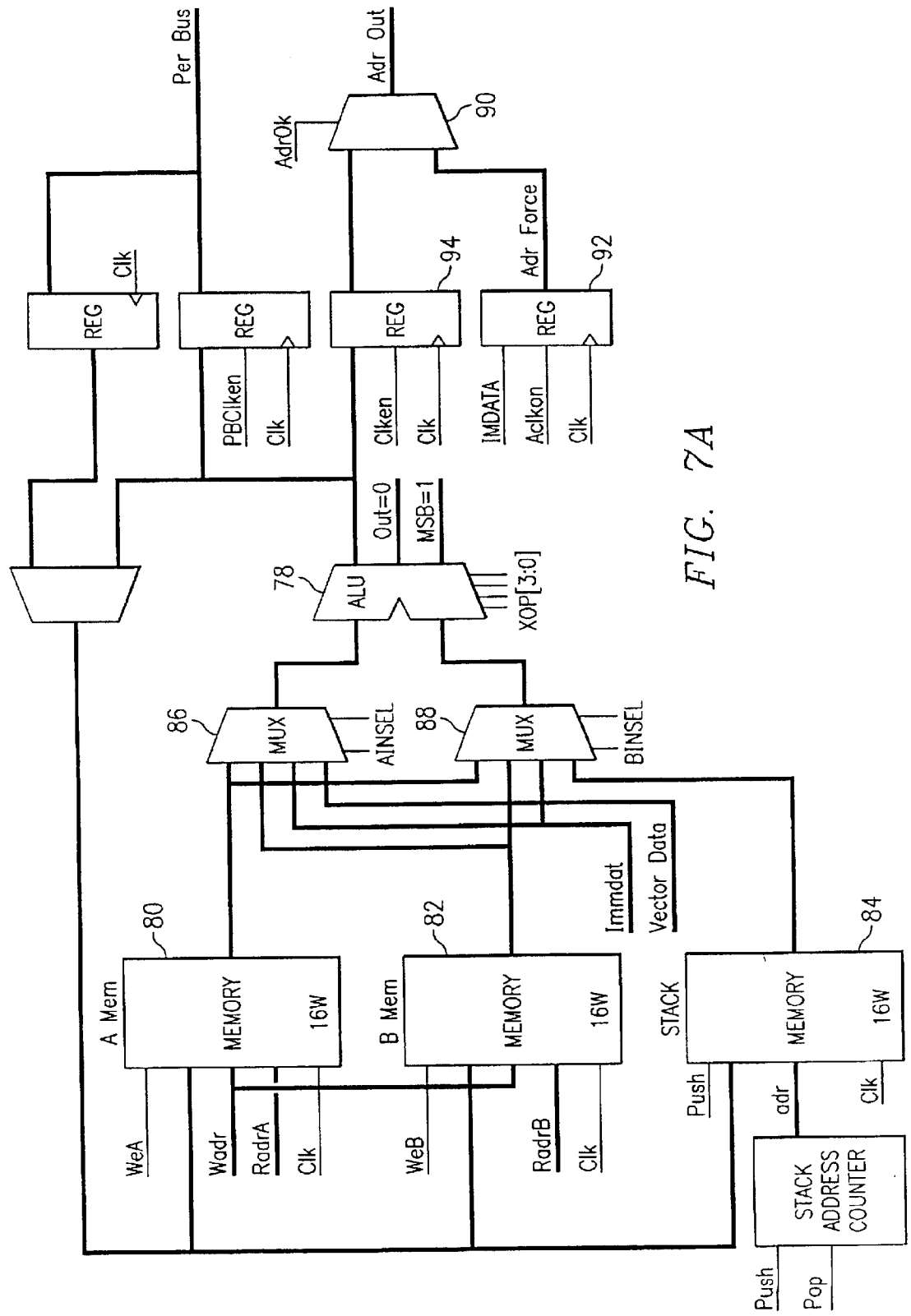
FIGS. 7A and 7B depict block diagrams of an arithmetic logic unit address data generator for x, y and z and for vector addresses respectively.
Figure 7B:
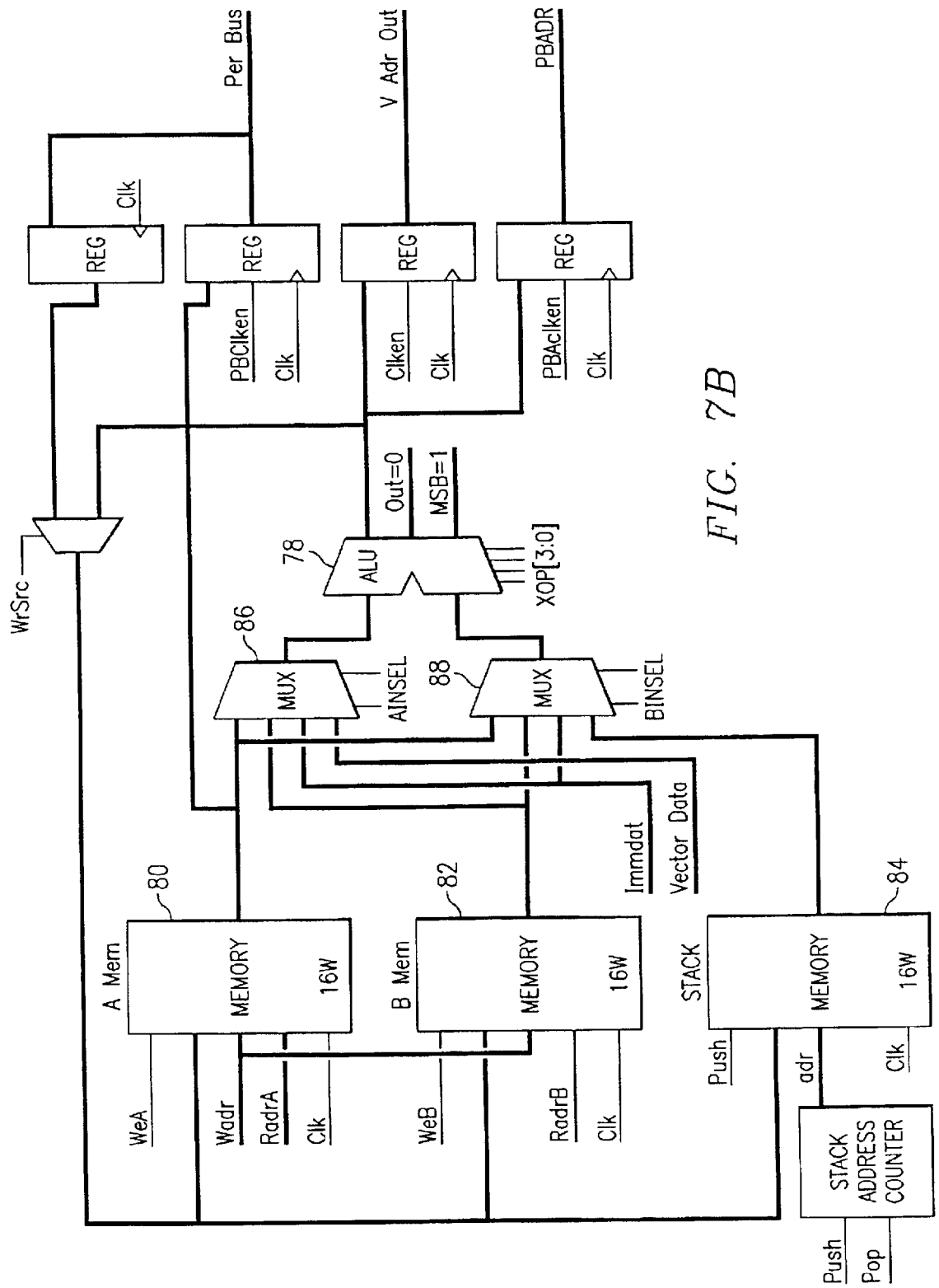

Referring now to FIG. 7A, a block diagram depicts an arithmetical logic unit configured to generate address information from VLIW instructions. X, y, and z address data is generated for output to a device under test, with FIG. 7A depicting an x address circuitry for generating 16 x address signals. FIG. 7B depicts an arithmetical logic unit configured to generate vector address information. Although the v address generator uses the same basic circuitry as the x address generator, the v address generator outputs 20 bits instead of 16 and does not use an output mux.

An arithmetical logic unit 78 has two pools of 16-bit address registers 80 and 82 available for each VLIW instruction received. Registers 80 and 82 are triple-port 16-deep by 16 wide SRAMs with the first ports sourcing the operands for the device address ALU and the third port storing the result of the operation. The output of the arithmetic logic unit operation may also be stored back into stack memory 84. Input to ALU 78 from register 80 or 82 is selected from one of four possible inputs by mux 86 or 88 respectively. An output mux 90 selects the result of the operation of ALU 78 from register 94 or an output from a forcing register 92 for application to a device under test.

Figure 8:
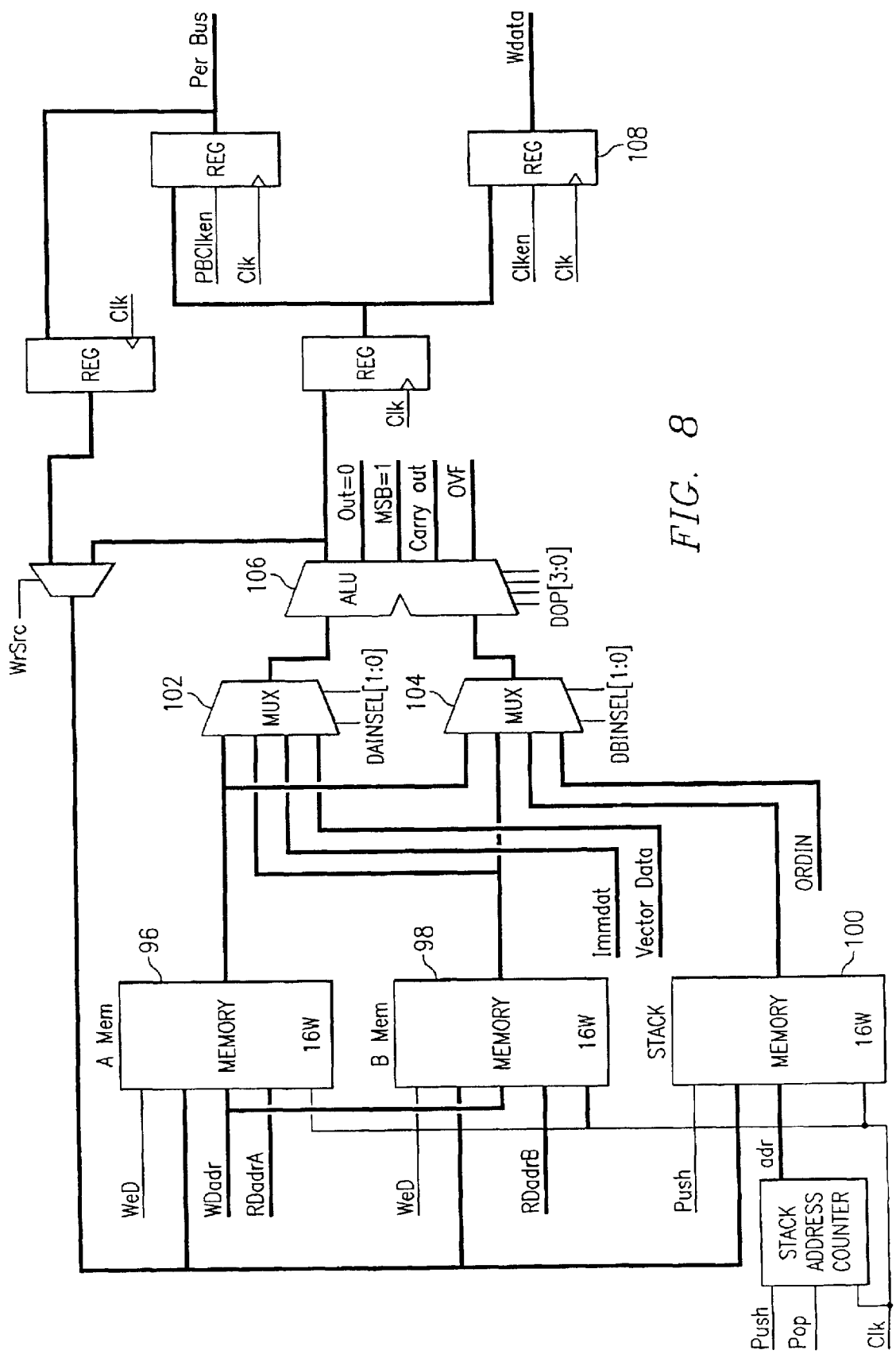
FIG. 8 depicts a block diagram of an arithmetic logic unit storage data generator.
Figure 9:
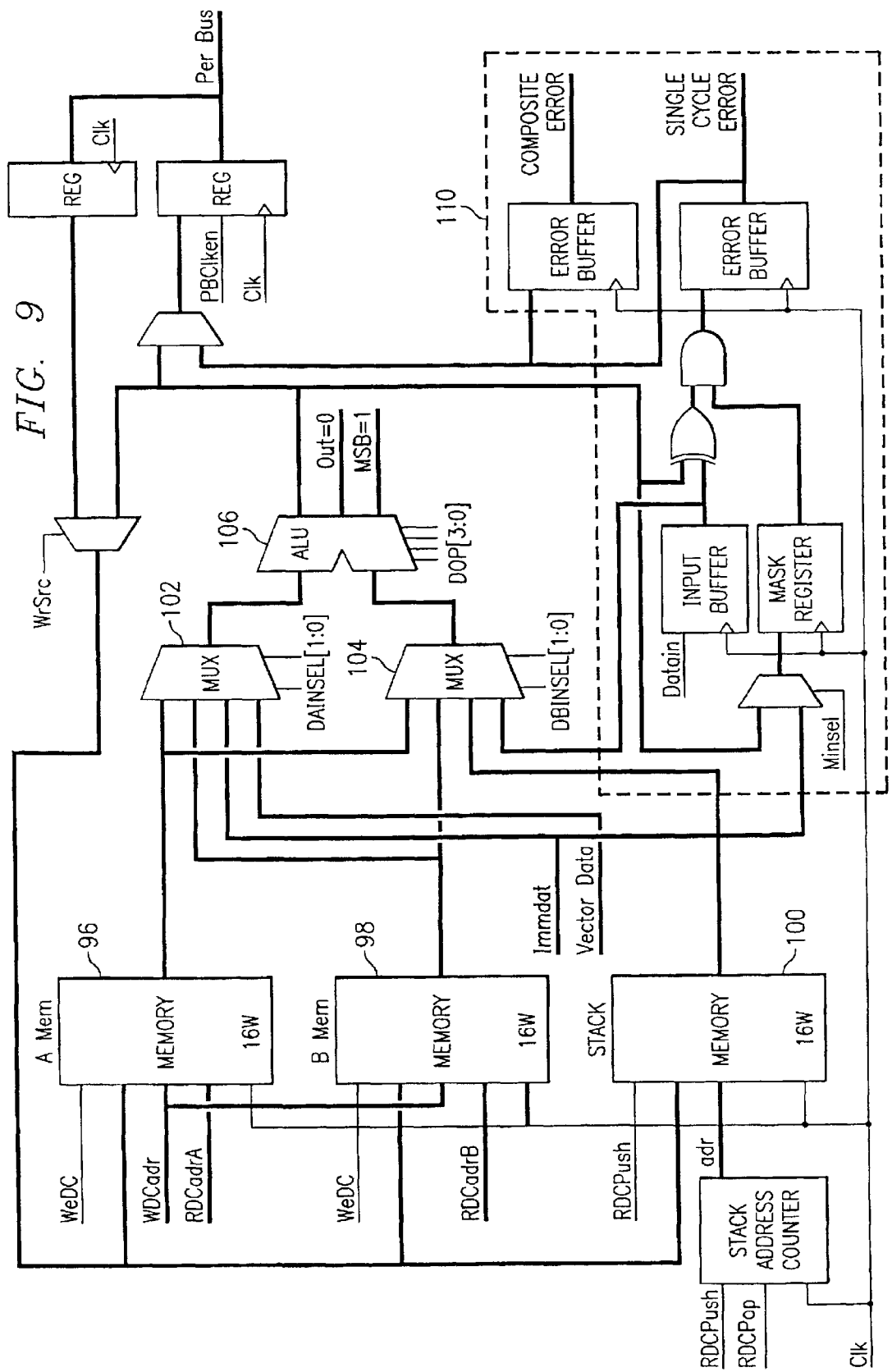
FIG. 9 depicts a block diagram of an arithmetic logic unit storage data generator and read comparator.

Referring now to FIG. 8, a block diagram depicts an arithmetic logic unit configured to generate storage data for storage on a device under test. Thirty-two bits of write storage data is generated with each VLIW instruction performed by the arithmetic logic unit. The output of the arithmetic logic unit operation may also be stored in memory or stack memory for subsequent use. As depicted by FIG. 9, comparison data is generated by an arithmetic logic unit configuration substantially similar to the configuration of FIG. 8. The comparison data is for comparison with read data, with erroneous data storage noted in an error buffer along with the actual storage data and read data. Thus, actual error data may be sent to global data master 18 for tracking and more indepth analysis Individual bits of the data read from the device under test may be selectively masked off as a "don't care" comparison.

An arithmetical logic unit 106 has two pools of 16 32-bit data registers 96 and 98 available for each VLIW instruction received. Registers 96 and 98 are double-port 16-deep by 32 wide SRAMs with the first port sourcing an operand for the device address ALU and the second port storing the result of the operation. The result of the ALU operation may be stored in either of register 96 or 98 or may be pushed in stack register 100. Mux 102 and 104 select one of four inputs for the ALU 106 to generate data for output to a device under test from an output register 108. In the data compare circuit depicted by FIG. 9, the output of the ALU provides expected data for comparison with read data by a compare circuit 110.

Referring again to FIG. 4, address and control data from sequencer 36 and storage data from data generator 38 proceed to crosswitch 40 through data comparator 46 and to the device under test for storage. Scratch memory 48 is SRAM that is available to the sequencer to store values. For instance, PMU 54 measures voltage and current values from the device under test which sequencer 36 may store in scratch memory 48.

Data is read back from the device under test through data comparator 46 into crossbar switch 40 and capture memory 52. Data comparator board 46 compares the voltage level of read data to insure that voltage levels for logical zeros and ones fall within a predetermined allowable range. The read data is then provided to data generator 38 for comparison against predetermined results to determine whether errors exist in the device under test's ability to store data. If an error is detected, data generator 38 provides the address, control and expected data with the device under test read data to error buffer 50. Processor 26 may access error buffer 50 to download actual data errors and provide the errors through the network to test executive host 14.

One unique advantage of test site 24 is its ability to combine arithmetically generated data with vector data for storage on a device under test. Vector memory 44 provides storage space that allows patterns for address, control and storage data to be predefined and applied to the device under test by the sequencer. A vector memory address generator in sequencer 36 controls the flow of data from vector memory 44 to determine which groups of data are applied to a device under test. The vector memory is divided into x address, y address, z address, compared data and write data sections, each of which may provide data to the device under test in combination with arithmetically generated data. The inclusion of vector memory data with arithmetically generated data advantageously allows testing of defects that are difficult to simulate solely with arithmetically generated data.

Another important and unique advantage of the present invention is the improved flexibility provided to test any number of devices with a wide variety of test recipes. By taking advantage of the network architecture, test sites may be distributed over a wide area with test recipes and related data updated through the network and actual tests executed and controlled from a central location.

Although the present invention has been described in detail, it should be understood that various changes, substitutions and alterations can be made hereto without departing from the spirit and scope of the invention as defined by the appended claims.

What is claimed is:

1. A distributed memory test system comprising:
   a host computer storing a plurality of different test recipes;
   plural test sites distributed distal from the host computer, each test site adapted to interface with a memory device under test, each test site having an embedded processor; and
   a network interfaced with the host computer and the plural test sites, the network communicating respective test recipes from the host computer to respective embedded processors for execution by respective test sites, wherein the host computer provides at least one of the test sites with a test recipe different from a recipe provided to another test site.

2. The system of claim 1 wherein the memory device under test comprises a flash memory device.

3. The system of claim 1 wherein the memory device under test comprises a fast page DRAM.

4. The system of claim 1 wherein the memory device under test comprises an EDO DRAM.

5. The system of claim 1 wherein the memory device under test comprises a SDRAM.

6. The system of claim 1 wherein the memory device under test comprises a DDR.

7. The system of claim 1 wherein the memory device under test comprises a SRAM.

8. The system of claim 1 wherein the memory device under test comprises a EEPROM.

9. The system of claim 1 wherein the network comprises Ethernet.

10. The system of claim 9 wherein the test recipe comprises XML formatted data.

11. The system of claim 10 wherein each embedded processor accepts the XML formatted recipe data to generate instructions for testing the memory device under test.

12. The system of claim 1 wherein the network comprises a local area network.

13. The system of claim 1 wherein the network comprises the internet.

14. The system of claim 13 wherein the test recipe comprises XML formatted data communicated from the host computer to a test site using TCP/IP.

15. The system of claim 13 wherein the test recipe comprises XML formatted data communicated from the host computer to a test site using NFS.

16. The system of claim 1 wherein the test recipe comprises instructions for performing algorithmic testing at the test site.

17. The system of claim 1 wherein the test recipe comprises instructions for performing vector testing at the test site.

18. The system of claim 1 further comprising:
plural host computers interfaced with the network, each host computer having one or more test recipes;
wherein each host computer controls tests performed by at least one test site.

19. The system of claim 18 further comprising a test designer interfaced with the network, the test designer operational to create the test recipes and communicate the test recipes to the host computers.

20. The method of claim 1, wherein each of the test recipes comprises test parameters.

21. The method of claim 20, wherein different test recipes comprise common production recipes and different test parameters.

22. A method for testing memory devices, the method comprising:
communicating a first test recipe from a host computer over a network to a first test site;
communicating a second test recipe, different from the first test recipe, from a host computer over a network to a second test site;
translating the test recipes at the respective test sites into test instructions; and
testing respective memory devices at the respective test sites in accordance with the instructions.

23. The method of claim 22 wherein communicating further comprises sending the test recipe as XML formatted data.

24. The method of claim 23 wherein the network comprises Ethernet.

25. The method of claim 23 wherein the network comprises a local area network.

26. The method of claim 23 wherein the network comprises the internet.

27. The method of claim 23 wherein the network comprises a wide area network.

28. The method of claim 23 wherein sending the XML formatted data further comprises sending the data using TCP/IP.

29. The method of claim 23 wherein sending the XML formatted data further comprises sending the data using NFS.

30. The method of claim 28 wherein the XML formatted data is downloaded from the host to the test site by FTP.

31. The method of claim 22 wherein translating the test recipe further comprises:
reading the test recipe with a processor at the test site;
associating the recipe with instructions stored at the test site;
executing the associated instructions to generate test data for storage on the memory device;
reading the data from the memory device; and
comparing the read data with a predetermined result to determine whether the memory device accurately stores data.

32. The method of claim 31 further comprising:
formatting the results from the comparing step into XML formatted data; and
sending the results to the host computer.

33. The method of claim 31 wherein the executing step comprises executing the instructions with a sequencer at the test site.

34. The method of claim 31 wherein the instructions call vectors from vector memory stored at the test site.

35. The method of claim 34 wherein the test data comprises address data and storage data, the address data generated algorithmically and the storage data called from vector memory.

36. The method of claim 34 wherein the test data comprises address data and storage data, the storage data generated algorithmically and the address data called from vector memory.

37. The method of claim 22, wherein the first test recipe is different than the second test recipe at least because the first and second test recipe comprise different test parameters.

38. An apparatus for testing a memory device, the apparatus comprising:
an adapter for physical interfacing with the memory device under test;
a test engine interfaced with the adapter to send test data to the memory device according to test instructions and to read stored data from the memory device for comparison with predetermined results, wherein the test instructions comprise instructions to perform vector testing; and
a processor interfaced with the test engine and adapted to interface with a network, the processor operable to receive a test recipe from the network and to translate the test recipe into test instructions for execution by the test engine.

39. The apparatus of claim 38, wherein the test engine comprises a sequencer.

40. The apparatus of claim 38, wherein the test instructions comprise:
instructions to call storage data from vector memory; and
instructions to algorithmically generate address data.

41. The apparatus of claim 38, wherein the test instructions comprise:
instructions to call address data from vector memory; and
instructions to algorithmically generate storage data.

42. A distributed memory test system comprising:
a host computer having one or more test recipes;
plural test sites distributed distal from the host computer, each test site adapted to interface with a memory device under test, each test site having an embedded processor; and
a network interfaced with the host computer and the plural test sites, the network communicating the test recipe from the host computer to the embedded processor for execution of the test recipe by the test site, wherein the test recipe comprises instructions for performing vector testing at the test site.

43. A method for testing memory devices, the method comprising:
communicating a test recipe from a host computer over a network to a test site;
translating the test recipe with a processor at the test site into test instructions; and
testing a memory device at the test site in accordance with the instructions, wherein the instructions call vectors from vector memory stored at the test site.

44. The method of claim 43, further comprising:
calling storage data from vector memory; and
generating address data algorithmically.

45. The method of claim 43, further comprising:
calling address data from vector memory; and
generating storage data algorithmically.

* * * * *